US012557320B2

(12) United States Patent
Xie et al.

(10) Patent No.: US 12,557,320 B2
(45) Date of Patent: Feb. 17, 2026

(54) FVBP WITHOUT BACKSIDE SI RECESS

(71) Applicant: INTERNATIONAL BUSINESS MACHINES CORPORATION, Armonk, NY (US)

(72) Inventors: Ruilong Xie, Niskayuna, NY (US); Kisik Choi, Watervliet, NY (US); Terence Hook, Jericho Center, VT (US); Alexander Reznicek, Troy, NY (US); Daniel Schmidt, Niskayuna, NY (US); Tsung-Sheng Kang, Ballston Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 18/327,114

(22) Filed: Jun. 1, 2023

(65) Prior Publication Data
US 2024/0405112 A1    Dec. 5, 2024

(51) Int. Cl.
| H10D 30/43 | (2025.01) |
| H01L 23/485 | (2006.01) |
| H01L 23/522 | (2006.01) |
| H01L 23/528 | (2006.01) |
| H10D 30/01 | (2025.01) |
| H10D 30/67 | (2025.01) |
| H10D 62/10 | (2025.01) |

(Continued)

(52) U.S. Cl.
CPC ......... *H10D 30/43* (2025.01); *H01L 23/5286* (2013.01); *H10D 30/014* (2025.01); *H10D 30/6729* (2025.01); *H10D 30/6735* (2025.01); *H10D 62/121* (2025.01); *H10D 89/611* (2025.01)

(58) Field of Classification Search
CPC .. H10D 30/43; H10D 30/014; H10D 30/6729; H10D 30/6735; H10D 62/121; H10D 89/611; H01L 23/5286; H01L 23/485; H01L 21/76895; H01L 21/76898
See application file for complete search history.

(56) References Cited

U.S. PATENT DOCUMENTS 9,570,395 B1    2/2017  Sengupta
10,347,546 B2    7/2019  Zeng
(Continued)

OTHER PUBLICATIONS

International Searching Authority, "Notification of Transmittal of the International Search Report and the Written Opinion of the International Searching Authority, or Declaration," Patent Cooperation Treaty, Sep. 13, 2024, 11 pages, International Application No. PCT/EP2024/064209.

(Continued)

*Primary Examiner* — Herve-Louis Y Assouman
(74) *Attorney, Agent, or Firm* — Samuel A. Waldbaum

(57) ABSTRACT

A microelectronic structure including a nanosheet transistor that includes a source/drain. A frontside contact that includes a first section located on the frontside of the source/drain and a via section that extends to the backside of the nanosheet transistor. A shallow isolation layer located around a portion of the via section the first frontside contact. A backside metal line located on a backside surface of the via section and located on a backside surface of the shallow trench isolation layer. A dielectric liner located along a sidewall of the backside metal line and located along a bottom surface of the backside metal line.

20 Claims, 7 Drawing Sheets

(51) Int. Cl.
  *H10D 84/01* (2025.01)
  *H10D 84/85* (2025.01)
  *H10D 89/60* (2025.01)

(56) References Cited

U.S. PATENT DOCUMENTS

| | | |
|---|---|---|
| 10,586,765 B2 | 3/2020 | Smith |
| 10,636,739 B2 | 4/2020 | Beyne |
| 10,700,207 B2 | 6/2020 | Chen |
| 11,101,217 B2 | 8/2021 | Xie |
| 11,264,327 B2 | 3/2022 | Chiang |
| 11,355,601 B2 | 6/2022 | Chiang |
| 11,521,927 B2 | 12/2022 | Xie |
| 2014/0057430 A1* | 2/2014 | Lee .................. H01L 21/76844 438/653 |
| 2015/0060967 A1 | 3/2015 | Yokoyama et al. |
| 2020/0105671 A1 | 4/2020 | Lai |
| 2020/0373301 A1* | 11/2020 | Kim ....................... H10D 84/85 |
| 2021/0351079 A1 | 11/2021 | Su |
| 2021/0375722 A1* | 12/2021 | Kim ..................... H10D 84/038 |
| 2021/0376093 A1 | 12/2021 | Chu |
| 2021/0399099 A1 | 12/2021 | Chu |
| 2022/0199530 A1 | 6/2022 | Huang |
| 2022/0285518 A1 | 9/2022 | Cho |
| 2023/0100113 A1 | 3/2023 | Xie et al. |

OTHER PUBLICATIONS

Gupta et al., "Buried Power Rail Integration with Si FinFETs for CMOS Scaling beyond the 5 nm Node", 2020 Symposium on VLSI Technology Digest of Technical Papers THL.6, © 2020 IEEE, 2 pages.

Prasad et al., "Buried Power Rails and Back-side Power Grids: Arm® CPU Power Delivery Network Design Beyond 5nm", © 2019 IEEE, IEDM19, pp. 19.1.1-19.1.4.

\* cited by examiner

TOP DOWN VIEW

CROSS-SECTION Y

CROSS-SECTION X

CROSS-SECTION Y

CROSS-SECTION X

CROSS-SECTION Y

CROSS-SECTION X

CROSS-SECTION X

CROSS-SECTION Y

CROSS- SECTION X

CROSS- SECTION Y

FVBP WITHOUT BACKSIDE SI RECESS

BACKGROUND

The present invention generally relates to the field of microelectronics, and more particularly to formation of a backside metal line.

Nanosheet is the lead device architecture in continuing CMOS scaling. However, nanosheet technology has shown issues when scaling down such that as the devices become smaller and closer together, they are interfering with each other. With the number of devices being fitted in a smaller area it is becoming harder to form a backside contact that will create a short with adjacent components.

BRIEF SUMMARY

Additional aspects and/or advantages will be set forth in part in the description which follows and, in part, will be apparent from the description, or may be learned by practice of the invention.

A microelectronic structure including a nanosheet transistor that includes a source/drain. A frontside contact that includes a first section located on the frontside of the source/drain and a via section that extends to the backside of the nanosheet transistor. A shallow isolation layer located around a portion of the via section the first frontside contact. A backside metal line located on a backside surface of the via section and located on a backside surface of the shallow trench isolation layer. A dielectric liner located along a sidewall of the backside metal line and located along a bottom surface of the backside metal line.

A microelectronic structure including a first nanosheet transistor that includes a first source/drain. A first frontside contact that includes a first section located on the frontside of the first source/drain and a via section that extends to the backside of the first nanosheet transistor. A second nanosheet transistor that includes a second source/drain. A second frontside contact that includes a first section located on the frontside of the second source/drain and a via section that extends to the backside of the second nanosheet transistor. A shallow isolation layer located around a portion of the via section of the first frontside contact and the located around a portion of the via section of the second frontside contact. A first backside metal line located on a backside surface of the via section of the first frontside contact and located on a backside surface of the shallow trench isolation layer. A second backside metal line located on a backside surface of the via section of the second frontside contact and located on a backside surface of the shallow trench isolation layer. A first dielectric liner located along a sidewall of the first backside metal line and located along a bottom surface of the first backside metal line, and a second dielectric liner is located along a sidewall of the second backside metal line and located along a bottom surface of the second backside metal line. A substrate layer located between the first dielectric liner and the second dielectric liner.

A microelectronic structure including a first nanosheet transistor that includes a first source/drain. A first frontside contact that includes a first section located on the frontside of the first source/drain and a via section that extends to the backside of the first nanosheet transistor. A second nanosheet transistor that includes a second source/drain. A second frontside contact that includes a first section located on the frontside of the second source/drain and a via section that extends to the backside of the second nanosheet transistor. A shallow isolation layer located around a portion of the via section of the first frontside contact and the located around a portion of the via section of the second frontside contact. A first backside metal line located on a backside surface of the via section of the first frontside contact and located on a backside surface of the shallow trench isolation layer. A second backside metal line located on a backside surface of the via section of the second frontside contact and located on a backside surface of the shallow trench isolation layer. A first dielectric liner located along a sidewall of the first backside metal line and located along a bottom surface of the first backside metal line, and a second dielectric liner is located along a sidewall of the second backside metal line and located along a bottom surface of the second backside metal line. A passive device located between the first dielectric liner and the second dielectric liner.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
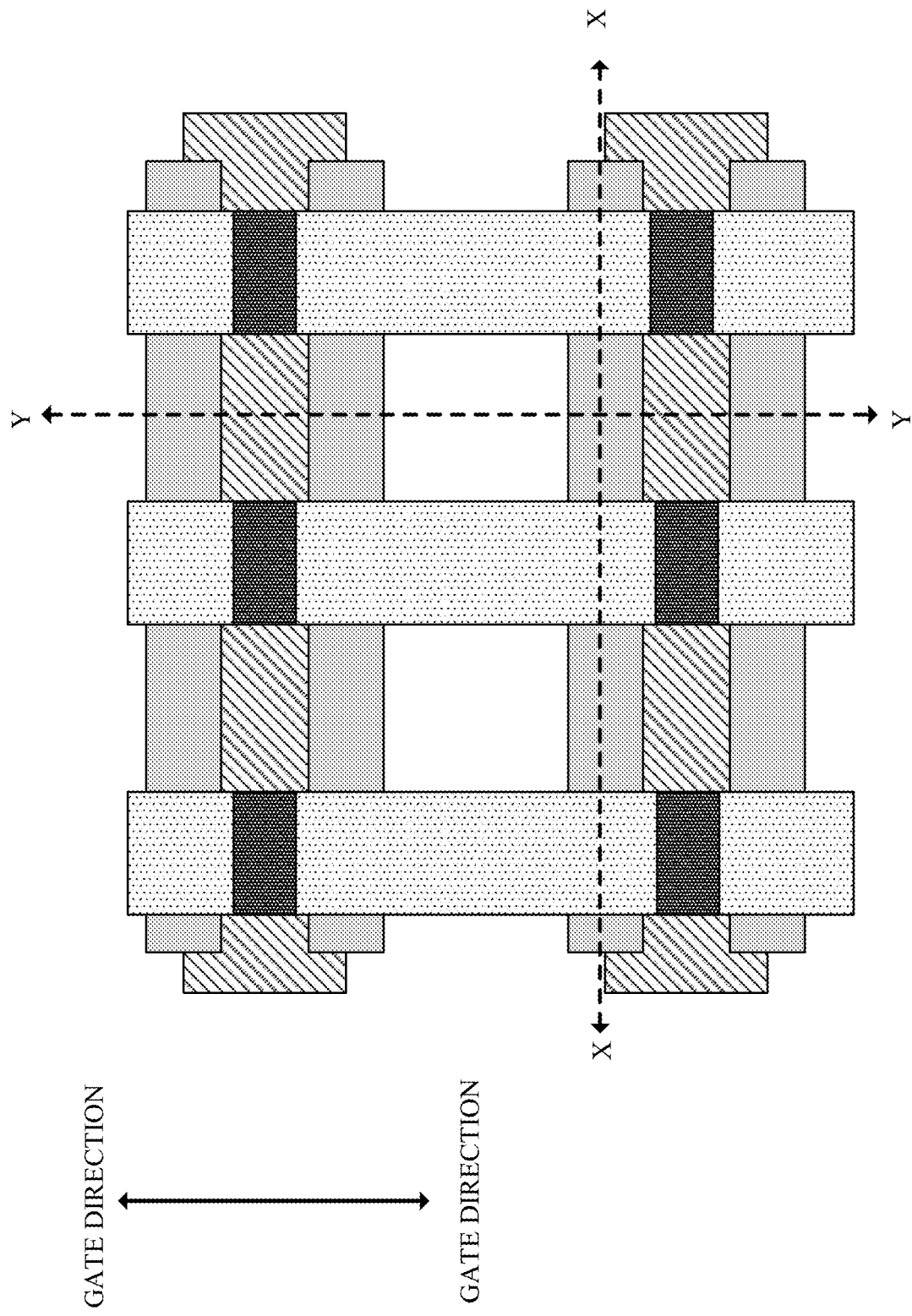
FIG. 1 illustrates a top-down view of multiple nano devices, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of +8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed towards forming backside power rails (or first level of backside metal lines), where a portion of the original substrate is not removed. The remaining substrate allows for passive devices (e.g. diode) to be located on the remaining Si with sufficient thickness. During backside processing of the active device (e.g., a nanosheet transistor) the substrate is typically fully removed to expose the backside surfaces of the components of the device and a backside interlayer dielectric layer is located between adjacent backside metal lines.

In contrast, the present invention does not remove all the substrate but instead leaves an inverted U/V-shape portion. Trenches are formed the substrate such a backside surface of the contact via is exposed. The remaining thickness of the Si substrate is thicker than shallow trench isolation (STI), allows easy formation of passive devices (such as ESD diode) formation (not shown, on other region of the wafer). The trenches are lined with a dielectric liner to create a barrier between the backside power rail (or backside metal lines) and the remaining substrate. The backside interlayer dielectric layer is not located between the backside power rails but instead the backside interlayer dielectric layer is located on the backside surface of the substrate, the backside power rails, and the dielectric liner.

FIG. 1 illustrates a top-down view of multiple nano devices which can be comprised of electronic components such as transistors, in accordance with the embodiment of the present invention. The cross-section X extends horizontally through the nano stacks of one of the devices. Cross section Y is perpendicular to cross section X, where cross section Y is through a source/drain region that spans across multiple nano stacks.

Figure 3:
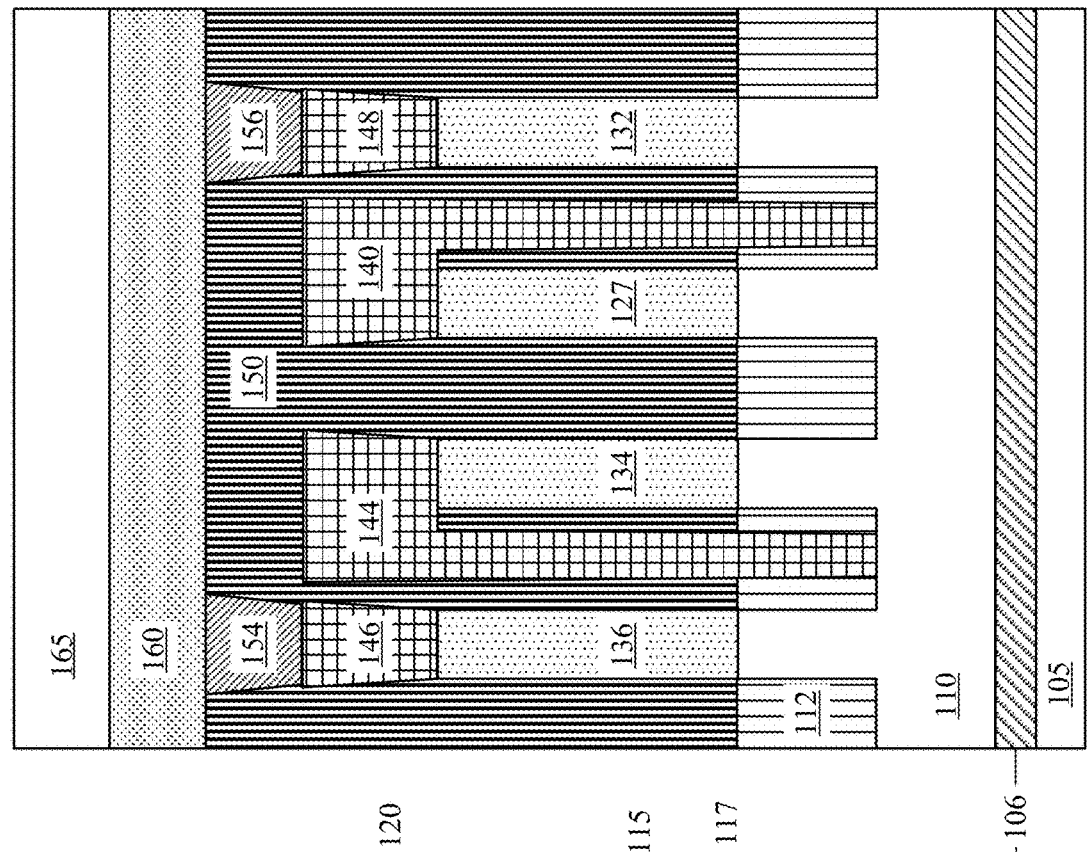
FIG. 3 illustrates a cross section Y of the source/drain region after the frontside processing of the nano devices, in accordance with the embodiment of the present invention.
Figure 2:
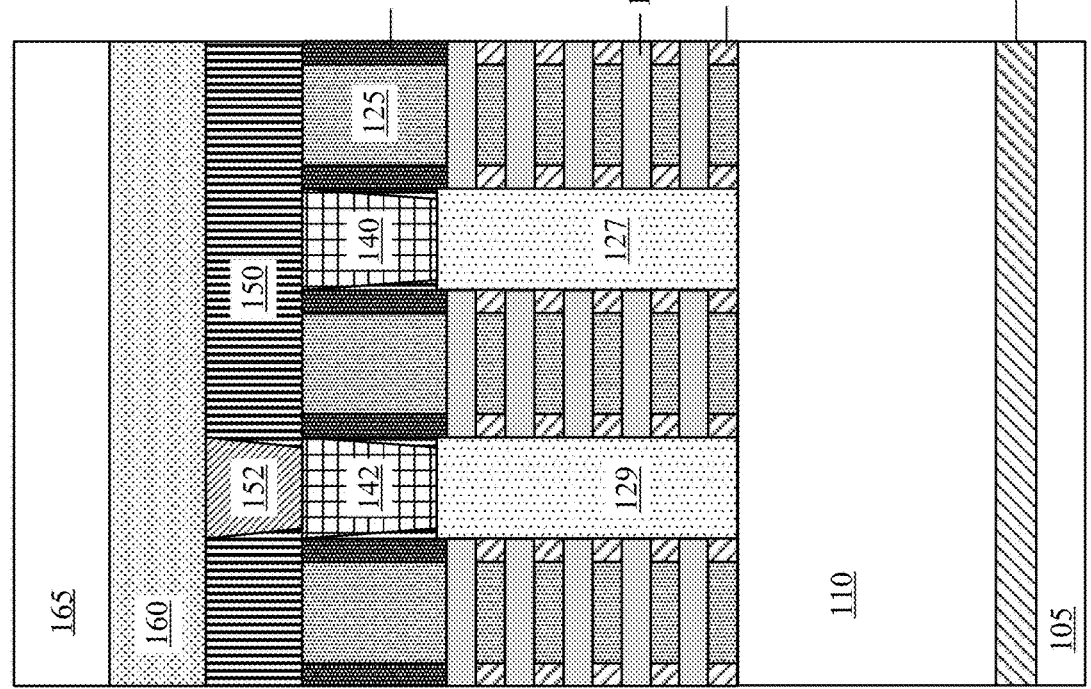
FIG. 2 illustrates a cross section X of the nano stack after the frontside processing of the nano devices, in accordance with the embodiment of the present invention.

Referring now to FIGS. 2, and 3, a structure is shown during an intermediate step of a method of fabricating nano devices, such as, a nanosheet transistor structure after the completion of the frontside processing according to an embodiment of the invention.

FIGS. 2 and 3 illustrate the processing stage of the structure after completing the frontside processing of the nano devices. FIG. 2 illustrates a first substrate 105, an etch stop 106, a second substrate 110, a plurality of channel layers 115, an inner spacer 117, a gate 125, an upper spacer 120, a first source/drain 127, a second source/drain 129, a frontside interlayer dielectric layer 150, a first frontside source/drain contact 142, a first backside source/drain contact 140, a first frontside via contact 152, a back-end-of-the-line (BEOL) layer 160, and a carrier wafer 165.

The first substrate 105 and the second substrate 110 can be, for example, a material including, but not necessarily limited to, silicon (Si), silicon germanium (SiGe), Si: C (carbon doped silicon), carbon doped silicon germanium (SiGe: C), III-V, II-V compound semiconductor or another like semiconductor. In addition, multiple layers of the semiconductor materials can be used as the semiconductor material of the first substrate 105 and the second substrate 110. In some embodiments, first substrate 105 and the second substrate 110 includes both semiconductor materials and dielectric materials. The semiconductor first substrate 105 and the second substrate 110 may also comprise an organic semiconductor or a layered semiconductor such as, for example, Si/SiGe, a silicon-on-insulator or a SiGe-on-insulator. A portion or the entire semiconductor first substrate 105 and the second substrate 110 may also be comprised of an amorphous, polycrystalline, or monocrystalline. The semiconductor first substrate 105 and the second substrate 110 may be doped, undoped or contain doped regions and undoped regions therein.

FIG. 2 illustrates a plurality of nanosheet columns, where each of the nanosheet columns is comprised of a plurality of channel layers 115, an inner spacer 117 located at the ends of each of the channel layers 115, an upper spacer 120 located on top of the top channel layer 115, and a gate 125 locate between the upper spacer segments 120 and around the channel layers 115. Gate 125 can be comprised of, for example, a gate dielectric liner, such as high-k dielectric like $HfO_2$, $ZrO_2$, $HfL_aO_x$, etc., and work function layers, such as TIN, TiAlC, TiC, etc., and conductive metal fills, like W. A source/drain 127, 129 is located between each of the nano sheet columns. A first frontside source/drain contact 142 is located on the top of the second source/drain 129. The first backside source/drain contact 140 is located on the first source/drain 127. The first backside source/drain contact 140 includes a via section the extends to the backside of the nano device as illustrated in FIG. 3. A frontside interlayer dielectric layer 150 is located on top of gate 125, the upper spacer 120, the first backside source/drain contact 140, the first frontside source/drain contact 142. The first frontside via contact 152 is in the frontside interlayer dielectric layer 150 and on top of the first frontside source/drain contact 142. The BEOL layer 160 is located on top of the frontside interlayer dielectric layer 150 and the first frontside via contact 152. The carrier wafer 165 is located on top of the BEOL layer 160.

FIG. 3 illustrates a cross-section of the source/drain region after the completion of the frontside processing of the nano devises. FIG. 3 illustrates a shallow trench isolation layer 112, the first source/drain 127, a third source/drain 132, a fourth source/drain 134, a fifth source/drain 136, a second frontside source/drain contact 146, a third frontside source/drain contact 148, the first backside source/drain contact 140, a second backside source/drain contact 144, the frontside interlayer dielectric layer 150, a second frontside via contact 154, a third frontside via contact 156, the BEOL layer 160, and the carrier wafer 165. A second frontside source/drain contact 146 is located on the top of the fifth source/drain 136, and the third frontside source/drain contact 148 is located on top of the third source/drain 132. A second backside source/drain contact 144 is located on the third source/drain 134. The first backside source/drain contact 140 and the second backside source/drain contact 144 each include a via section the extends to the backside of the nano device, where the via section extends into the shallow trench isolation layer 112.

The first source/drain 127, the second source/drain 129, the third source/drain 132, the fourth source/drain 134, and the fifth source/drain 136 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (TI) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 5:
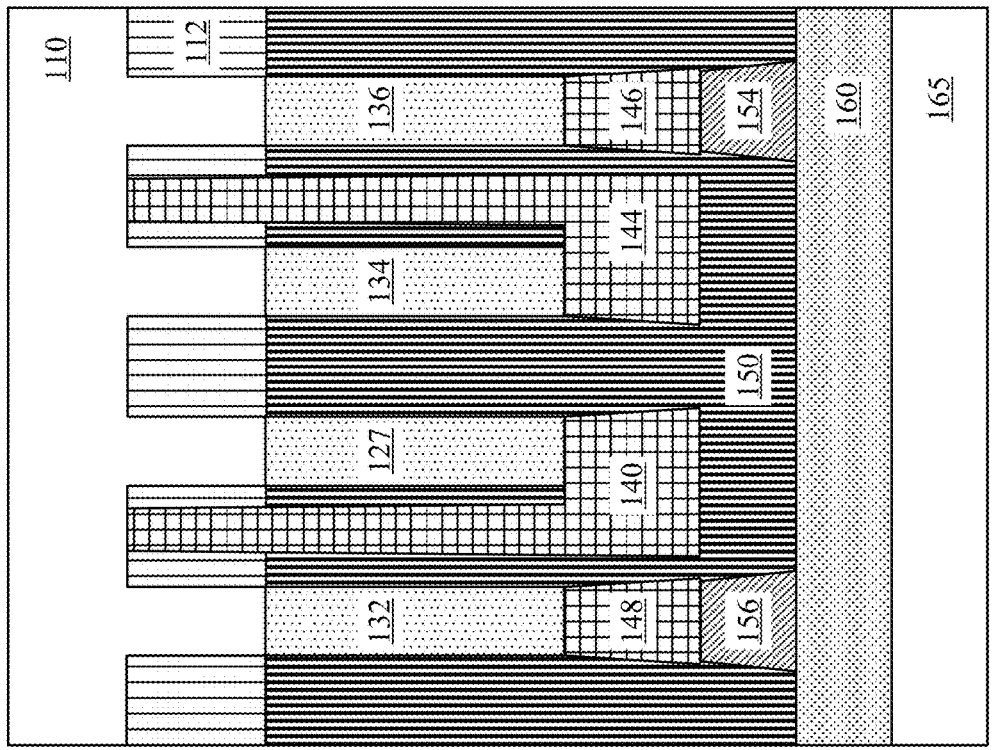
FIG. 5 illustrates a cross section Y of the source/drain region after flipping the nano devices for backside processing and the removal of the first substrate and the etch stop, in accordance with the embodiment of the present invention.
Figure 4:
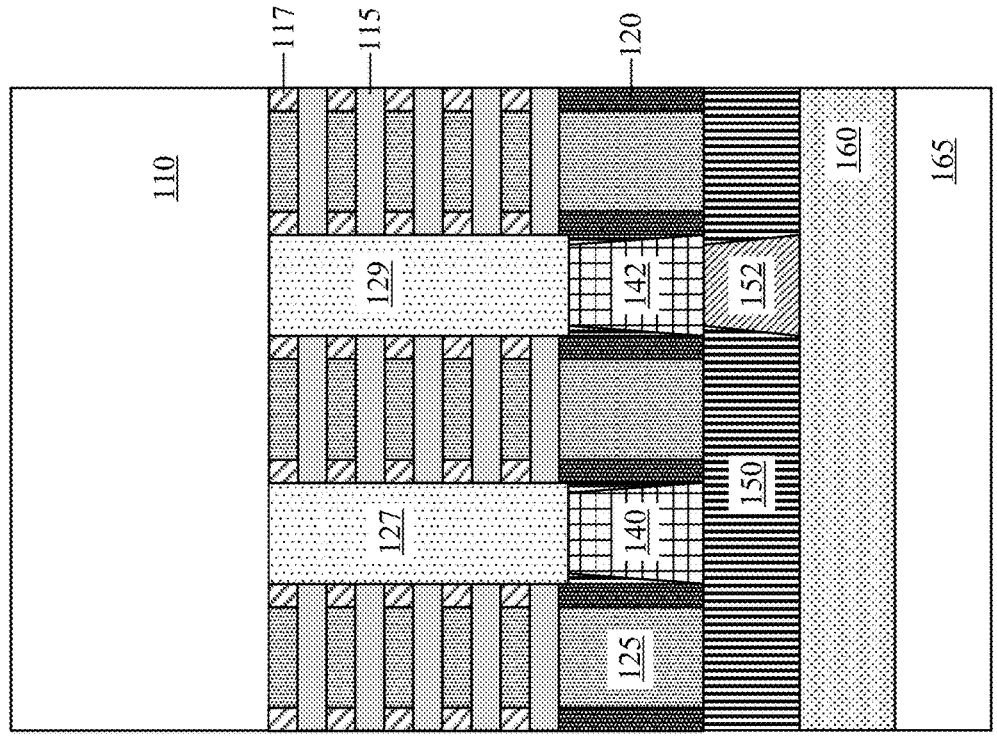
FIG. 4 illustrates a cross section X of the nano stack after flipping the nano devices for backside processing and the removal of the first substrate and the etch stop, in accordance with the embodiment of the present invention.

FIGS. 4 and 5 illustrate the processing stage of the structure after flipping the nano devices for backside processing and the removal of the first substrate and the etch stop. The nano devices are flipped over to expose the backside of the nano devices for processing. The first substrate 105 and the etch stop 106 are removed to expose a backside surface of the second substrate 110.

At this point in fabrication, the second substrate 110 is removed in its entirety, but the present invention does not entirely remove the second substrate 110, as explained in further detail below.

Figure 7:
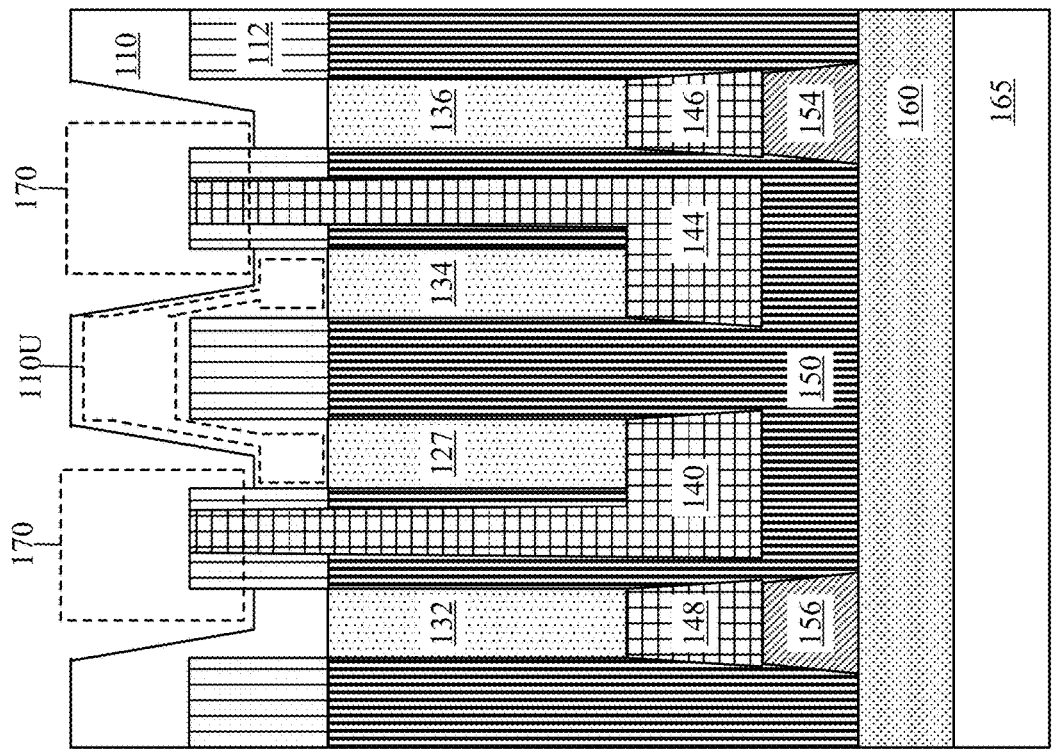
FIG. 7 illustrates a cross section Y of the source/drain region after the formation of a plurality of trenches in the second substrate, in accordance with the embodiment of the present invention.
Figure 6:
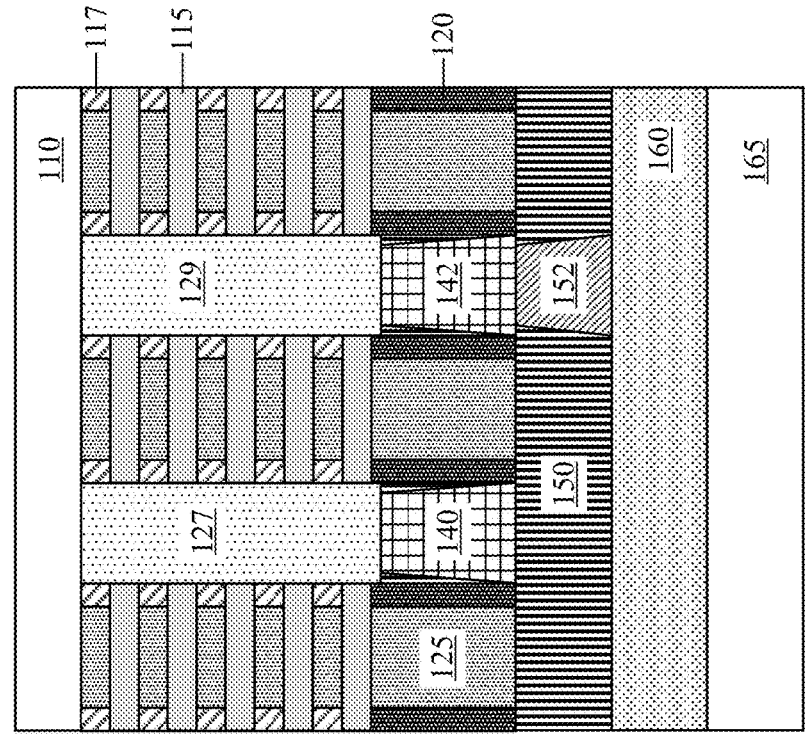
FIG. 6 illustrates a cross section X of the nano stack after removal of a portion of the second substrate, in accordance with the embodiment of the present invention.

FIGS. 6 and 7 illustrate the processing stage of the structure after the removal of portions of the second substrate 110. FIG. 6 illustrates that portions of the second substrate 110 are removed. As illustrated in cross-section X a portion of the remaining second substrate 110 is a horizontal bar of the second substrate 110 located on the backside surfaces of the nanosheet columns and the backside surface of the source/drains 127, 129. FIG. 7 illustrates a plurality of trenches 170 formed in the second substrate 110, where each trench 170 exposes a portion of the shallow trench isolation layer 112 and a backside surface of the via of one of the first or second backside source/drain contacts 140, 144. A continuous section of the second substrate 110 remains after the formation of the plurality of trenches 170, such that an inverted U-shape or V-shape section of the second substrate 110 remains between the trenches 170, as emphasized by dashed box 110U. The remaining second substrate 110 located at dashed box 110U leaves enough material of the second substrate 110 to allow for a passive device (e.g., a doped second substrate 110) to be located at a different located on the wafer but within the U/V-shape section of the second substrate 110. After the formation of the second substrate 110 can be doped for the formation of one or more passive devices prior to formation of the nano sheet layers, during the frontside fabrication process. The inverted U-shape or V-shape of the second substrate 110 as emphasized by dashed box 110U, allows for the passive device to be present after the backside processing is complete. Each of the plurality of trenches 170 exposes a backside surface of the shallow trench isolation layer 112, a side section of the shallow trench isolation layer 112, and a backside surface of one of the first or second backside source/drain contacts 140, 144.

Figure 8:
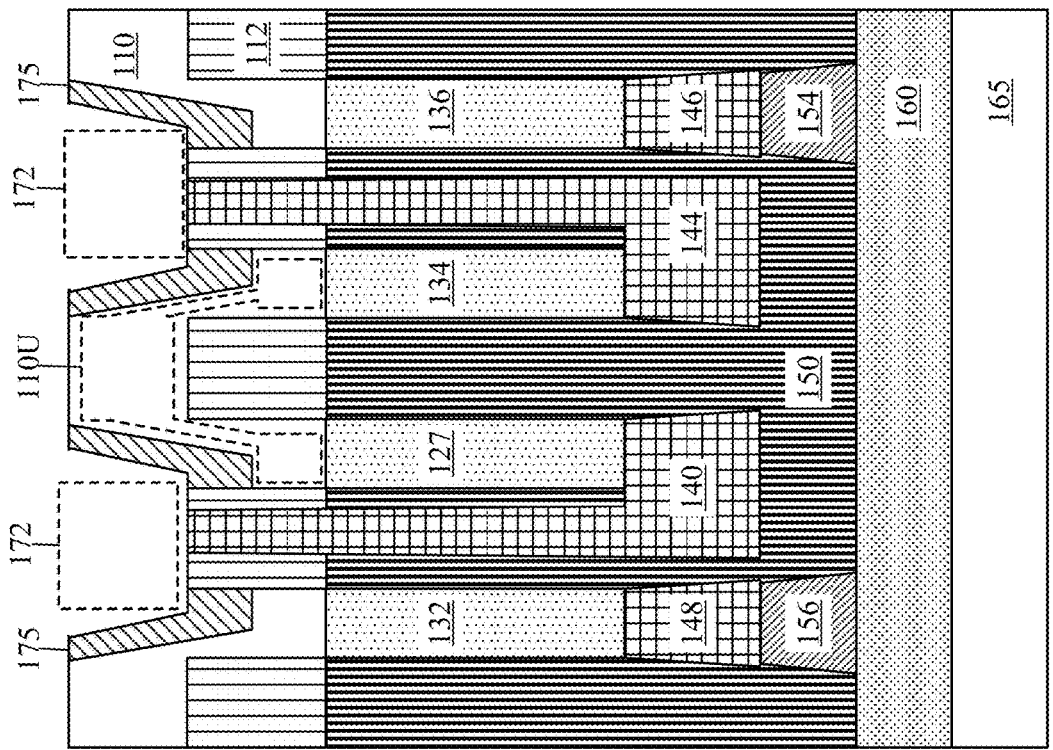
FIG. 8 illustrates a cross section X of the nano stack after formation and etch back of a dielectric liner, in accordance with the embodiment of the present invention.
Figure 9:
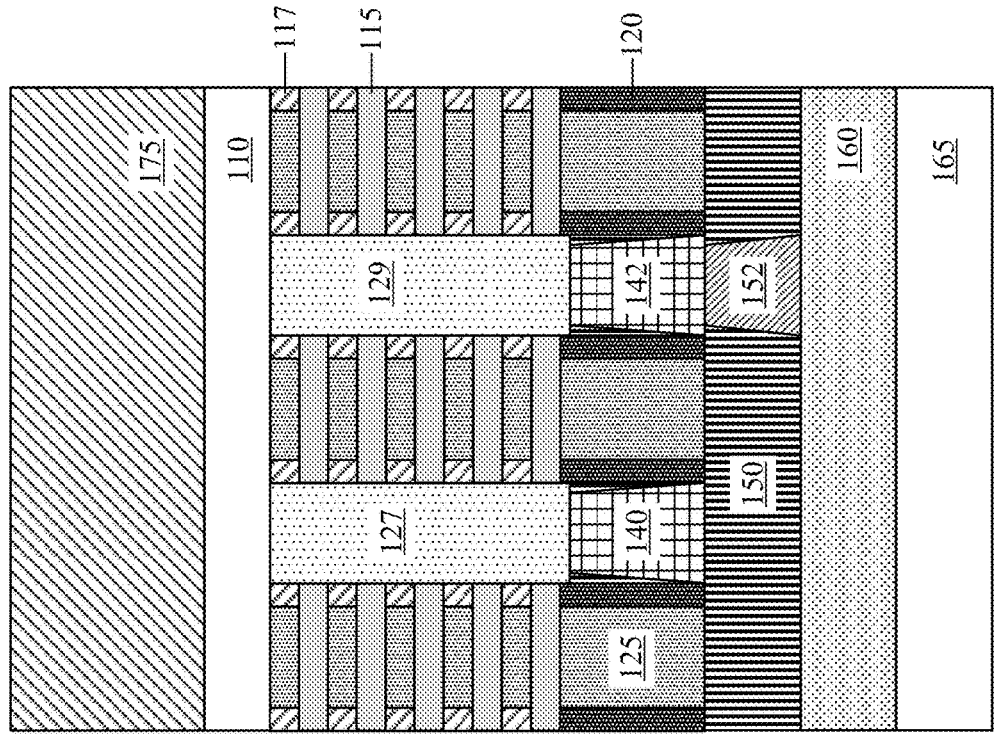
FIG. 9 illustrates a cross section Y of the source/drain region after formation and etch back of a dielectric liner, in accordance with the embodiment of the present invention.

FIGS. 8 and 9 illustrate the processing stage of the structure after formation and etch back of a dielectric liner 175. A dielectric liner 175 is formed on top of the exposed second substrate 110, as illustrated in FIG. 8, and within the plurality of trenches 170, as illustrated in FIG. 9. The dielectric liner 175 is etch back to remove any dielectric liner 175 located on top of the shallow trench isolation layer 112 and located on top of the backside surface of the first or second backside source/drain contacts 140, 144. The dielectric liner 175 can be comprised of, for example, SiN, SiBCN, SiOCN, SiC, SiOC, etc. A plurality of second trenches 172 are formed from the plurality of trenches 170. The dielectric liner 175 is located along the sidewalls of each of the plurality of second trenches 172 and in contact with the sides of the shallow trench isolation layer 112. The dielectric liner 175 does not form a continuous layer along the side/bottom boundaries of the second trench 172. The dielectric liner 175 is separated in a plurality of segments by the shallow trench isolation layer 112 and the via of one of the first or second backside source/drain contacts 140, 144. The segments of the dielectric liner 175 have a L-shape, where there is vertical/angled section and a horizontal section. The dielectric liner 175, the backside surface of the shallow trench isolation layer 112, and the backside surface of the first or second backside source/drain contacts 140, 144 form the side and bottom boundaries of each of the second trenches 172. A segment of the dielectric liner 175 is located on sides of the shallow trench isolation layer 112 that were exposed by the formation of trench 170. The etch back of the dielectric liner 175 separates the dielectric liner 175 into multiple segments. The dielectric liner 175 is in contact with the side of the shallow trench isolation layer 112 but is not in contact with the backside surface of the shallow trench isolation layer 112. The inverted U-shape or V-shape of the second substrate 110 as emphasized by dashed box 110U, is located between sections/segments of the dielectric liner 175 that are located in adjacent second trenches 173. Furthermore, inverted U-shape or V-shape of the second substrate 110 as emphasized by dashed box 110U are in contact with sections of the shallow trench isolation layer 112 located beneath the dielectric liner 175. A section of the shallow trench isolation layer 112 is located at the center of the inverted U-shape or V-shape of the second substrate 110 as emphasized by dashed box 110U. The section of the shallow trench isolation layer 112 is located between two vertical inverted U-shape or V-shape of the second substrate 110.

Figure 10:
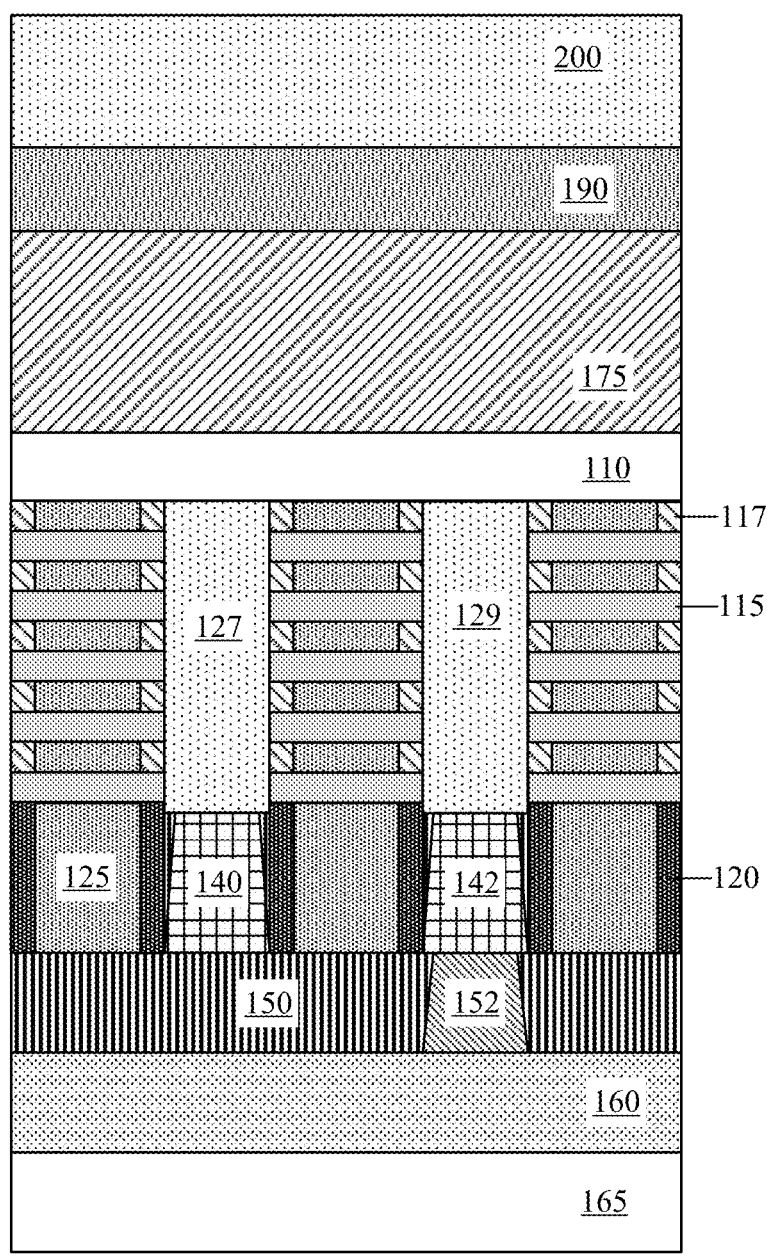
FIG. 10 illustrates a cross section X of the nano stack after formation backside metal line, a backside interlayer dielectric layer, and a backside-power-distribution-network (BSPDN), in accordance with the embodiment of the present invention.
Figure 11:
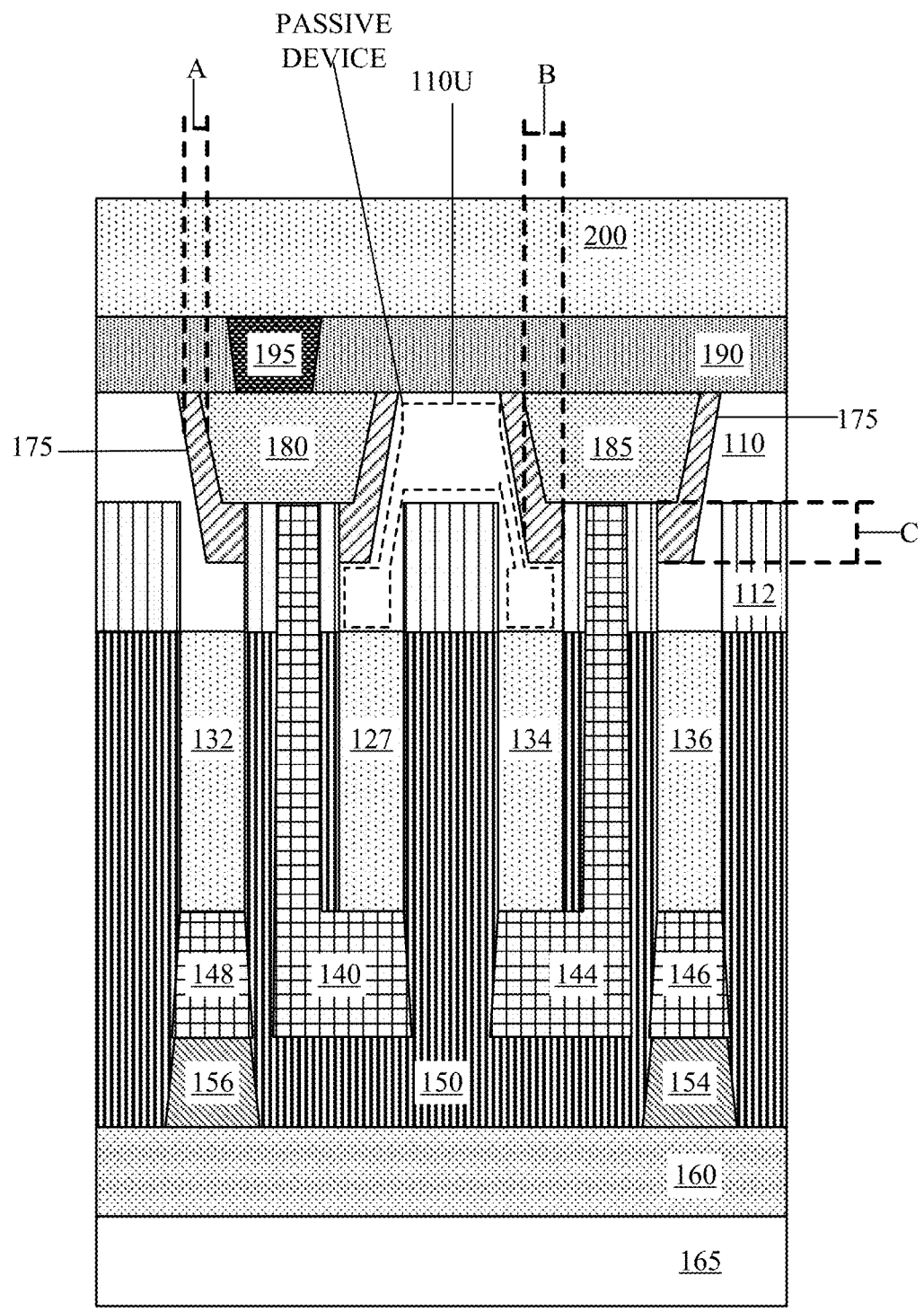
FIG. 11 illustrates a cross section Y of the source/drain region after formation backside metal line, a backside interlayer dielectric layer, and a backside-power-distribution-network (BSPDN), in accordance with the embodiment of the present invention.

FIGS. 10 and 11 illustrate the processing stage of the structure after formation first backside metal lines (or backside power rails) 180, 185, a backside interlayer dielectric layer 190, a connecting via contact 195, and a backside-power-distribution-network (BSPDN) 200. FIG. 10 illustrates a backside interlayer dielectric layer 190 located on top of the dielectric liner 175 and BSPDN 200 located on top of the backside interlayer dielectric layer 190. The second trenches 172 are filled with a conductive metal to form a first backside power rail 180 and a second backside power rail 185. The sidewalls of the first backside power rails 180 are in contact with the dielectric liner 175 and the bottom surface of the first backside power rails 180 is in contact with a backside surface of the dielectric liner 175, a backside surface of the shallow trench isolation layer 112, and a backside surface of the via of the first backside source/drain contacts 140. The dielectric liner 175 serves as a barrier between the first backside power rail 180 and the inverted U-shape or V-shape of the second substrate 110 as emphasized by dashed box 110U. The sidewalls of the second backside power rail 185 are in contact with the dielectric liner 175 and the bottom surface of the second backside power rail 185 is in contact with a backside surface of the dielectric liner 175, a backside surface of the shallow trench isolation layer 112, and a backside surface of the second backside source/drain contacts 144. The dielectric liner 175 serves as a barrier between the second backside power rails 185 and the inverted U-shape or V-shape of the second substrate 110 as emphasized by dashed box 110U.

The dimensions of the dielectric liner 175 are different based on the location of the dielectric liner 175. FIG. 11 emphasizes, for example, a first dimension A, a second dimension B, and a third dimension C. Dimension A represents the thickness/width of the dielectric liner 175 located between a sidewall of one of backside power rails 180, 185 and the second substrate 110. Dimension B represents the thickness/width of the dielectric liner 175 located between the sidewall of the shallow trench isolation layer 112 and the second substrate 110, where the value of dimension B is less than two times the value of dimension A. Dimension C represents the depth/thickness of the dielectric liner 175 located between the bottom surface of the backside power rails 180, 185 and the second substrate 110. The value of dimension C is greater than or equal to six nanometers.

A backside interlayer dielectric layer 190 is located on top of the second substrate 110, the dielectric liner 175, the first backside power rails 180, and the second backside power rails 185. A connecting contact 195 is formed in backside interlayer dielectric layer 190, where the connecting contact 195 is connected to the first backside power rails 180. A connecting contact 195 located in the backside interlayer dielectric layer 190 connected to the second backside power rails 185 is not shown. The BSPDN 200 is located on top of the backside interlayer dielectric layer 190 and on top of the connecting contact 195. As illustrated in FIG. 11, the inverted U-shape or V-shape of the second substrate 110 as emphasized by dashed box 110U allows for a significant amount of the second substrate 110 to remain after the backside processing of the nanosheet device/transistor is complete. This inverted U-shape or V-shape of the second substrate 110 as emphasized by dashed box 110U allows for a passive device to be located at this section of the second substrate 110 after the completion of backside processing of the nanosheet device/transistor.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
    a nanosheet transistor that includes a source/drain;
    a frontside contact that includes a first section located on the frontside of the source/drain and a via section that extends to a backside of the nanosheet transistor;
    a shallow isolation layer located around a portion of the via section the first frontside contact;
    a backside metal line located on a backside surface of the via section and located on a backside surface of a shallow trench isolation layer; and
    a dielectric liner located along a sidewall of the backside metal line and located along a bottom surface of the backside metal line, wherein the dielectric liner is in direct contact with a vertical side surface of the shallow trench isolation layer.

2. The microelectronic structure of claim 1, wherein the dielectric liner is comprised of at least two separate segments.

3. The microelectronic structure of claim 2, wherein each of the at least two separate segments of the dielectric liner have a L-shape, wherein a vertical section of the L-shape dielectric liner is located adjacent to the sidewall of the backside metal line, and wherein a horizontal section of the L-shape dielectric liner is located beneath the bottom surface of the backside metal line.

4. The microelectronic structure of claim 3, wherein the horizontal section of the L-shape dielectric liner is located adjacent to a sidewall of the shallow trench isolation layer.

5. The microelectronic structure of claim 4, wherein the vertical section of the L-shape dielectric liner has a first width as measured horizontally from a sidewall of the backside metal line across the vertical section of L-shape dielectric liner to an adjacent layer.

6. The microelectronic structure of claim 5, wherein the horizontal section of the L-shape dielectric liner has a second width as measure horizontally from the sidewall of the shallow trench isolation layer across the horizontal section of the L-shape dielectric liner to the adjacent layer.

7. The microelectronic structure of claim 6, wherein a value of the second width is two times greater than a value of the first width.

8. The microelectronic structure of claim 6, wherein the adjacent layer is comprised of a substrate material.

9. The microelectronic structure of claim 6, wherein the adjacent layer is comprised of a doped substrate material.

10. A microelectronic structure comprising:
    a first nanosheet transistor that includes a first source/drain;
    a first frontside contact that includes a first section located on a frontside of the first source/drain and a via section that extends to a backside of the first nanosheet transistor;
    a second nanosheet transistor that includes a second source/drain;
    a second frontside contact that includes a first section located on a frontside of the second source/drain and a via section that extends to a backside of the second nanosheet transistor;
    a shallow isolation layer located around a portion of the via section of the first frontside contact and the located around a portion of the via section of the second frontside contact;
    a first backside metal line located on a backside surface of the via section of the first frontside contact and located on a backside surface of a shallow trench isolation layer;

a second backside metal line located on a backside surface of the via section of the second frontside contact and located on a backside surface of the shallow trench isolation layer;

a first dielectric liner located along a sidewall of the first backside metal line and located along a bottom surface of the first backside metal line, and a second dielectric liner is located along a sidewall of the second backside metal line and located along a bottom surface of the second backside metal line; and a substrate layer located between the first dielectric liner and the second dielectric liner.

11. The microelectronic structure of claim 10, wherein the first dielectric liner is comprised of at least two separate segments and the second dielectric liner is comprise of at least two separate segments, wherein each of the at least two separate segments of the first dielectric liner have a L-shape and the each of the at least two separate segments of the second dielectric liner have a L-shape, wherein a vertical section of the L-shape first dielectric liner is located adjacent to the sidewall of the first backside metal line, and wherein a horizontal section of the L-shape first dielectric liner is located beneath the bottom surface of the first backside metal line, and wherein a vertical section of the L-shape second dielectric liner is located adjacent to the sidewall of the second backside metal line, and wherein a horizontal section of the L-shape second dielectric liner is located beneath the bottom surface of the second backside metal line.

12. The microelectronic structure of claim 11, wherein the horizontal section of the L-shape first dielectric liner and the horizontal section of the L-shape second dielectric liner located adjacent to a sidewall of the shallow trench isolation layer.

13. The microelectronic structure of claim 12, wherein the vertical section of the L-shape first dielectric liner has a first width as measured horizontally from a sidewall of the first backside metal line across the vertical section of L-shape first dielectric liner to the adjacent substrate layer.

14. The microelectronic structure of claim 13, wherein the horizontal section of the L-shape first dielectric liner has a second width as measure horizontally from the sidewall of the shallow trench isolation layer across the horizontal section of the L-shape dielectric liner to the adjacent substrate layer.

15. The microelectronic structure of claim 14, wherein a value of the second width is two times greater than a value of the first width.

16. The microelectronic structure of claim 10, wherein the substrate layer has an inverted U/V-shaped.

17. The microelectronic structure of claim 16, wherein a section of the shallow trench isolation layer is located between vertical sections of the inverted U/V shaped substrate layer.

18. The microelectronic structure of claim 10, wherein the substrate layer is in contact with the sidewall of the first dielectric liner, the sidewall of the second dielectric liner, and a sidewall of shallow trench isolation layer.

19. The microelectronic structure of claim 10, wherein the substrate layer is comprised of a doped substrate material.

20. A microelectronic structure comprising:

a first nanosheet transistor that includes a first source/drain;

a first frontside contact that includes a first section located on the frontside of the first source/drain and a via section that extends to the backside of the first nanosheet transistor;

a second nanosheet transistor that includes a second source/drain;

a second frontside contact that includes a first section located on the frontside of the second source/drain and a via section that extends to the backside of the second nanosheet transistor;

a shallow isolation layer located around a portion of the via section of the first frontside contact and the located around a portion of the via section of the second frontside contact;

a first backside metal line located on a backside surface of the via section of the first frontside contact and located on a backside surface of the shallow trench isolation layer;

a second backside metal line located on a backside surface of the via section of the second frontside contact and located on a backside surface of the shallow trench isolation layer;

a first dielectric liner located along a sidewall of the first backside metal line and located along a bottom surface of the first backside metal line, and a second dielectric liner is located along a sidewall of the second backside metal line and located along a bottom surface of the second backside metal line; and a passive device located between the first dielectric liner and the second dielectric liner.

* * * * *